US012603629B2

(12) United States Patent
Guenard et al.

(10) Patent No.: US 12,603,629 B2
(45) Date of Patent: Apr. 14, 2026

(54) COMPOSITE STRUCTURE AND ASSOCIATED PRODUCTION METHOD

(71) Applicant: Soitec, Bernin (FR)

(72) Inventors: Pascal Guenard, Froges (FR); Ionut Radu, Crolles (FR); Didier Landru, Le Champ-près-Froges (FR); Eric Desbonnets, Lumbin (FR)

(73) Assignee: Soitec, Bernin (FR)

( * ) Notice: Subject to any disclaimer, the term of this patent is extended or adjusted under 35 U.S.C. 154(b) by 1688 days.

(21) Appl. No.: 15/769,698

(22) PCT Filed: Oct. 17, 2016

(86) PCT No.: PCT/FR2016/052675
§ 371 (c)(1),
(2) Date: Apr. 19, 2018

(87) PCT Pub. No.: WO2017/068270
PCT Pub. Date: Apr. 27, 2017

(65) Prior Publication Data
US 2018/0316329 A1      Nov. 1, 2018

(30) Foreign Application Priority Data
Oct. 20, 2015      (FR) ...................................... 1559994

(51) Int. Cl.
*H03H 9/02*          (2006.01)
*H03H 3/04*          (2006.01)
(Continued)

(52) U.S. Cl.
CPC .......... *H03H 3/04* (2013.01); *H03H 9/02031* (2013.01); *H03H 9/02102* (2013.01);
(Continued)

(58) Field of Classification Search
CPC ..... H01L 41/053; H01L 41/1873; H03H 3/04; H03H 9/02031; H03H 9/02102; H03H 9/02133; H03H 9/0504
(Continued)

(56) References Cited

U.S. PATENT DOCUMENTS 8,049,395 B2    11/2011  Kando
9,751,109 B2     9/2017  Moriya et al.
(Continued)

FOREIGN PATENT DOCUMENTS

CN          1788415 A      6/2006
CN       101505143 A      8/2009
(Continued)

OTHER PUBLICATIONS

Hashimoto et al., Recent Development of Temperature Compensated SAW Devices, Ultrasonics Symposium, 2011 IEEE International, Oct. 18, 2011, pp. 79-86.
(Continued)

*Primary Examiner* — Derek J Rosenau
(74) *Attorney, Agent, or Firm* — TraskBritt

(57) ABSTRACT

A composite structure for an acoustic wave device comprising a heterostructure includes: a useful layer of piezoelectric material, having a first face and a second face, the first face being arranged at a first bonding interface on a support substrate having a coefficient of thermal expansion less than that of the useful layer, wherein the composite structure further comprises a functional layer, an entire surface of which is arranged at a second bonding interface on the second face of the useful layer and having a coefficient of thermal expansion less than that of the useful layer. Methods are used for producing such a composite structure.

18 Claims, 5 Drawing Sheets

(51) Int. Cl.

| | |
|---|---|
| *H03H 9/05* | (2006.01) |
| *H10N 30/00* | (2023.01) |
| *H10N 30/072* | (2023.01) |
| *H10N 30/88* | (2023.01) |
| *H10N 30/853* | (2023.01) |

(52) U.S. Cl.
CPC .... *H03H 9/02133* (2013.01); *H03H 9/02574* (2013.01); *H03H 9/0504* (2013.01); *H10N 30/072* (2023.02); *H10N 30/704* (2024.05); *H10N 30/88* (2023.02); *H03H 2003/0407* (2013.01); *H10N 30/8542* (2023.02)

(58) Field of Classification Search
USPC ........................................ 310/346, 320, 321
See application file for complete search history.

(56) References Cited

U.S. PATENT DOCUMENTS

| | | | |
|---|---|---|---|
| 2004/0253795 A1 | 12/2004 | Martinez et al. | |
| 2004/0263026 A1* | 12/2004 | Wang ..................... | H03H 9/564 310/341 |
| 2008/0079334 A1* | 4/2008 | Yong ........................ | H03H 9/08 310/361 |
| 2008/0169724 A1 | 7/2008 | Bhattacharjee et al. | |
| 2009/0004438 A1 | 1/2009 | Urakawa | |
| 2009/0236935 A1* | 9/2009 | Kando ............... | H03H 9/02055 310/313 R |
| 2017/0213955 A1* | 7/2017 | Silvano De Sousa ...................... | B81B 3/0021 |

FOREIGN PATENT DOCUMENTS

| | | | |
|---|---|---|---|
| CN | 101569100 | A | 10/2009 |
| CN | 101874429 | A | 10/2010 |
| CN | 102027813 | A | 4/2011 |
| CN | 102341900 | A | 2/2012 |
| CN | 101416570 | | 5/2012 |
| CN | 104205631 | A | 12/2014 |
| CN | 104979440 | A | 10/2015 |
| EP | 2104228 | A1 | 9/2009 |
| JP | 10-297931 | A | 11/1998 |
| JP | 2004-159262 | A | 6/2004 |
| JP | 2009-124696 | A | 6/2009 |
| JP | 2014-236387 | A | 12/2014 |
| TW | 219354 | B | 1/1994 |
| TW | 449937 | B | 8/2001 |
| WO | 0237556 | A1 | 5/2002 |
| WO | 2008/078481 | A1 | 4/2010 |
| WO | 2014/129432 | A1 | 2/2017 |

OTHER PUBLICATIONS

International Search Report for International Application No. PCT/FR2016/052675 dated Feb. 14, 2017, 2 pages.
International Written Opinion for International Application No. PCT/FR2016/052675 dated Feb. 14, 2017, 5 pages.
Chinese First Office Action for Chinese Application No. 201680065643.1, dated Feb. 3, 2021, 10 pages with translation.
Chinese Search Report for Chinese Application No. 201680065643.1, dated Jan. 27, 2021, 3 pages with translation.
Japanese Notice of Reasons for Refusal for Japanese Application No. 2018-520170, dated Nov. 17, 2020, 14 pages with English translation.
Singapore Written Opinion for Singapore Application No. 11201803341Q dated Nov. 19, 2018, 6 pages.
Chinese Second Office Action for Chinese Application No. 201680065643.1, dated Jul. 6, 2021, 6 pages with translation.
Chinese Supplementary Search Report for Chinese Application No. 201680065643.1, dated Jul. 6, 2021, 3 pages with translation.
Chinese First Office Action and Search Report for Chinese Application No. 202210146142.3, dated Feb. 14, 2025, 20 pages with translation.
Korean Office Action for Application No. 10-2018-7014265 dated Aug. 9, 2023, 6 pages.
Search Report and Written Opinion of French Patent Application No. 1559994, mailed Aug. 10, 2016, 11 pages.
Chinese Decision of Rejection for Chinese Application 201680065643.1 dated Sep. 24, 2021, 5 pages translated.

* cited by examiner

COMPOSITE STRUCTURE AND ASSOCIATED PRODUCTION METHOD

CROSS-REFERENCE TO RELATED APPLICATIONS

This application is a national phase entry under 35 U.S.C. § 371 of International Patent Application PCT/FR2016/052675, filed Oct. 17, 2016, designating the United States of America and published as International Patent Publication WO 2017/068270 A1 on Apr. 27, 2017, which claims the benefit under Article 8 of the Patent Cooperation Treaty to French Patent Application Serial No. 1559994, filed Oct. 20, 2015.

TECHNICAL FIELD

The present application relates to the field of composite structures and heterostructures. More specifically, it relates to composite structures for acoustic wave devices.

BACKGROUND

In the field of surface or bulk acoustic wave devices (hereinafter "SAW" for "Surface Acoustic Wave" and "BAW" for "Bulk Acoustic Wave," respectively), heterostructures comprising a layer of lithium tantalate ($LiTaO_3$) arranged on a silicon substrate, are of increasing interest: on the one hand, because they are compatible with standard microelectronics equipment and processes owing to their silicon support substrate and, on the other hand, because they have technical advantages such as, for example, a lower temperature dependence of the frequency response of SAW devices, as explained in the article by K. Hashimoto, M. Kadota et al., "Recent development of temperature compensated SAW devices," IEEE Ultrason. Symp. 2011, pages 79 to 86.

$LiTaO_3$/Si heterostructures can, for example, be developed based on assembly through bonding by molecular adhesion of two substrates made of $LiTaO_3$ and Si, respectively. To manufacture acoustic wave devices on these heterostructures, it is advantageous to be able to reach a temperature of at least 250° C. to enable the use of materials and processes, guaranteeing that high-performing devices are achieved. The strength of the bonding interface between the $LiTaO_3$ layer and the Si support substrate is one of the essential factors in providing the structure with appropriate mechanical strength at high temperatures, in particular, at temperatures greater than or equal to 250° C.

This leads to the issue with increasing the heterostructure's bonding energy prior to any manufacturing steps of the acoustic wave device, at a temperature range around 250° C., despite the significant difference in coefficient of thermal expansion (CTE) of the two materials.

Moreover, when a heterostructure with a very thin $LiTaO_3$ layer is required (e.g., to manufacture bulk acoustic wave devices, i.e., BAW devices), one solution is to transfer the layer using the SMART CUT® process, including the formation of a fragile plane buried in a $LiTaO_3$ donor substrate by introducing light species such as hydrogen and/or helium, direct bonding of this donor substrate onto a silicon support substrate, and separation at the buried fragile plane so as to transfer a $LiTaO_3$ surface layer onto Si. It is known that the surface layer still has defects and light species in its thickness after it has been transferred. Therefore, to heal this layer, it is advantageous to anneal at a suitable temperature range to allow for the defects to be healed and the light species to be released without damaging the qualities of the thin layer transferred or the mechanical strength of the heterostructure. By way of example, the suitable temperature range to choose for a $LiTaO_3$ layer would be between 400° C. and 600° C.

Again, the issue is that $LiTaO_3$/Si heterostructures cannot handle these high thermal budgets, given the very significant difference in the coefficient of thermal expansion between the materials $LiTaO_3$ and Si.

BRIEF SUMMARY

One object of the disclosure, therefore, is to provide a structure and a manufacturing method overcoming the drawbacks of the prior art. More specifically, one object of the disclosure is to provide a composite structure, comprising a useful layer arranged on a support at an interface and capable of handling thermal budgets high enough to reinforce this interface or at least partially heal the defects on the surface layer or to develop certain components.

The disclosure relates to a composite structure for an acoustic wave device comprising a heterostructure including:

a useful layer of piezoelectric material, having a first face and a second face, the first face being arranged at a first bonding interface on a support substrate having a lower coefficient of thermal expansion than that of the useful layer.

The composite structure is remarkable in that it comprises a functional layer, an entire surface of which is arranged at a second bonding interface on the second face of the useful layer, and having a coefficient of thermal expansion less than that of the useful layer.

The composite structure according to the disclosure is thus able to handle a temperature higher than a limit temperature above which the heterostructure deteriorates or breaks in the absence of the functional layer. The composite structure thus makes it possible to apply heat treatments required to consolidate the first bonding interface of the heterostructure or to heal any defects on the useful layer. It would not have been possible to apply these heat treatments directly to the heterostructure due to the significant difference in coefficients of thermal expansion of the materials that the useful layer and the support substrate are made of.

According to advantageous characteristics of the disclosure, taken either separately or in combination:

The functional layer has a thickness greater than or equal to 10 microns;

The useful layer consists of a material selected from among the following group: lithium tantalate ($LiTaO_3$), lithium niobate ($LiNbO_3$), aluminum nitride (AlN), zinc oxide (ZnO);

The functional layer consists of a material selected from among the following group: silicon, III-V semiconductors, silicon carbide, glass, sapphire;

The support substrate consists of a material selected from among the following group: silicon, III-V semiconductors, silicon carbide, glass, sapphire;

The functional layer consists of the same material as that of the support substrate;

The adhesion energy of the first bonding interface between the useful layer and the support substrate of the heterostructure is greater than or equal to 1500 $mJ/m^2$;

The adhesion energy of the second bonding interface between the functional layer and the heterostructure is less than 1000 $mJ/m^2$, to enable its disassembly;

The functional layer comprises at least one first local opening enabling access to at least one first part of the second face of the useful layer and the first part of the second face of the useful layer comprises metal elements forming an acoustic wave device, in particular, a SAW device;

The functional layer comprises at least one first local opening enabling access to at least one first part of the second face of the useful layer;

The support substrate comprises at least one second local opening, at least partially facing the first local opening and enabling access to at least one second part of the first face of the useful layer;

The first and second parts respectively of the second and first faces of the useful layer comprise metal elements forming an acoustic wave device, in particular, a BAW device;

The functional layer and/or the support substrate comprise(s) metal contacts and/or electronic devices electrically connected to metal elements arranged on the useful layer.

The disclosure further relates to a method of manufacturing a composite structure for an acoustic wave device including a step of providing a heterostructure comprising a useful layer of piezoelectric material having a first face and a second face, the first face being arranged at a first bonding interface on a support substrate having a coefficient of thermal expansion less than that of the useful layer, the method is remarkable in that it includes the following:

An assembly step forming a second bonding interface between an entire surface of a functional layer and the second face of the useful layer to form a composite structure, the functional layer having a coefficient of thermal expansion less than that of the useful layer;

A step in which a heat treatment is applied to the composite structure at a temperature higher than a limit temperature above which the heterostructure deteriorates or breaks in the absence of the functional layer.

According to advantageous characteristics of the disclosure, taken either separately or in combination:

The assembly step comprises a step for adjusting the thickness of the functional layer, performed prior to the heat treatment step, to achieve a functional layer thickness greater than or equal to 10 microns;

The temperature of the heat treatment step is greater than or equal to 250° C., in particular, between 250° C. and 600° C.;

The manufacturing method includes a step in which the functional layer is removed after the heat treatment step, through disassembly at the second bonding interface between the functional layer and the useful layer;

The disassembly is performed by applying a mechanical stress at the second bonding interface of the composite structure;

The manufacturing method includes a step of locally removing the functional layer to enable access to a first part of the second face of the useful layer, and a step of producing acoustic wave devices comprising metal elements on the first part;

The manufacturing method further includes a step of locally removing the support substrate to enable access to a second part of the first face of the useful layer, and a step of producing acoustic wave devices comprising metal elements on the second part;

The manufacturing method further includes a step of producing components on the functional layer and/or on the support substrate, and/or a step of electrical connection between metal elements arranged on the useful layer and metal contacts arranged on the functional layer and/or on the support substrate.

BRIEF DESCRIPTION OF THE DRAWINGS

Further characteristics and advantages of the disclosure will be clear from the detailed description, made in reference to the appended figures, among which:

FIGS. 1a to 1e show a heterostructure and a composite structure according to the disclosure;

DETAILED DESCRIPTION

Figure 1A:
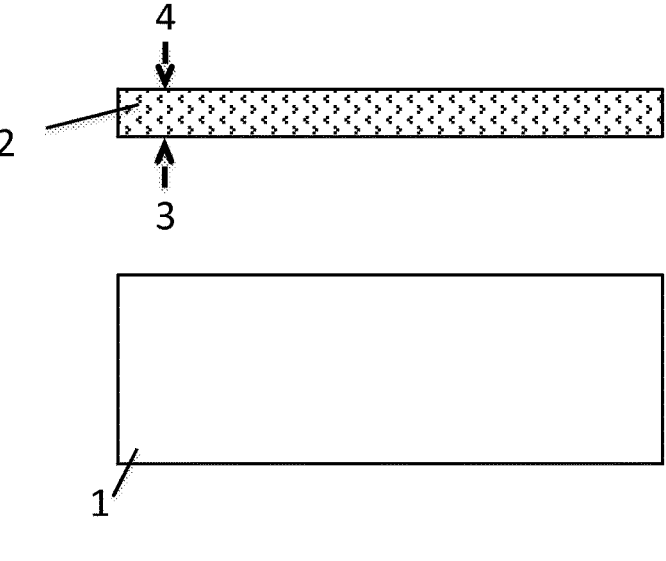
Figure 1B:
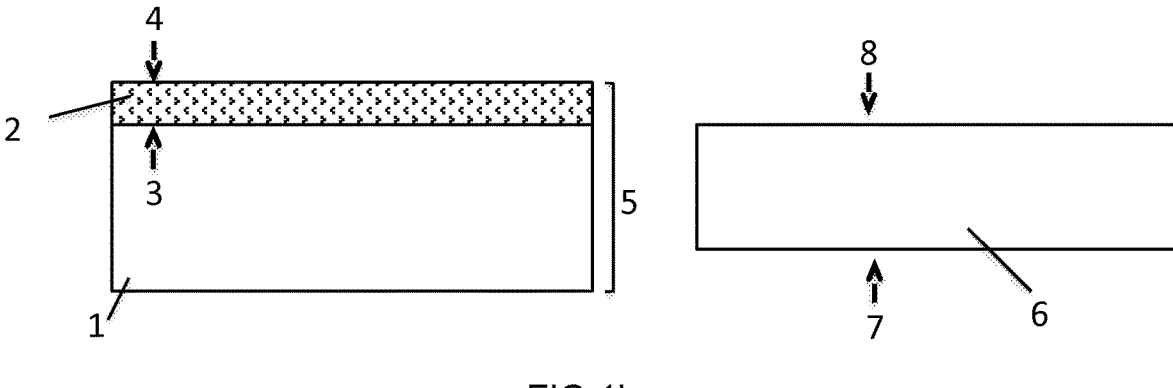
Figure 1C:
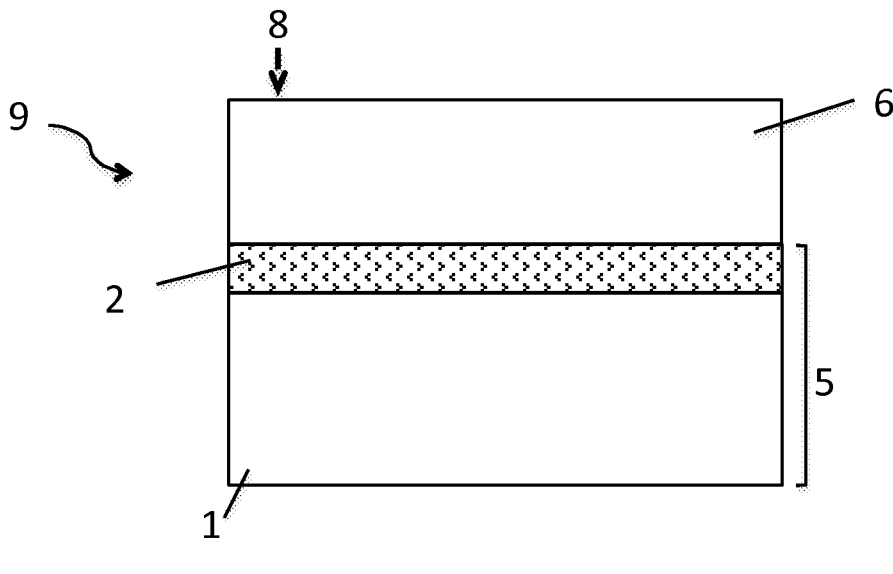

The disclosure relates to a composite structure 9 for acoustic wave devices comprising a heterostructure 5 (shown in FIG. 1c). The latter includes a useful layer 2 made of piezoelectric material, having a first face 3 and a second face 4, as shown in FIG. 1a. It also includes a support substrate 1 having a lower coefficient of thermal expansion than that of the useful layer 2. To form the heterostructure 5, the useful layer 2 is arranged along its first face 3 on the support substrate 1 (FIG. 1b). The useful layer 2 of the heterostructure 5 may consist of a material selected from among the following group: lithium tantalate ($LiTaO_3$), lithium niobate ($LiNbO_3$), aluminum nitride (AlN), and zinc oxide (ZnO). The support substrate 1 of the heterostructure 5 may consist of a material selected from among the following group: silicon, III-V semiconductors, silicon carbide, glass, and sapphire. The assembly of the useful layer 2 on the support substrate 1 is, for example, achieved through direct bonding by molecular adhesion. According to one variant, an additional layer (not shown), e.g., made of silicon oxide, may be deposited on the support substrate 1 and/or on the first face 3 of the useful layer prior to assembly. This configuration may, for example, facilitate bonding between the useful layer 2 and the support substrate 1.

There is a growing interest for a heterostructure 5 comprising a useful layer 2 made of piezoelectric material in the field of acoustic wave devices, which are among others used for mobile telephony applications and radiofrequency communications. Several steps are required to manufacture acoustic wave devices on a heterostructure 5, among which deposition of insulating and conductive layers, wet or dry etching, heat treatment (in the range of 150° C. to 250° C.). The applicant has observed that proper consolidation of the bonding interface between the useful layer 2 and the support substrate 1 favors the stability of the heterostructure 5 during device development steps, in particular, heat treatment steps. The object of the composite structure 9 according to the disclosure, therefore, is to make it possible to increase the bonding energy of the interface between the useful layer 2 and the support substrate 1 (called first bonding interface) of the heterostructure 5, in view of subsequent device development steps.

The composite structure 9 according to the disclosure thus comprises a functional layer 6, having two faces 7 and 8 (FIG. 1b). This layer 6 is assembled onto the second face 4 of the useful layer 2, so that the entire surface of one of its faces 7, 8 (in this case the face 7, in FIG. 1c) is arranged on the second face 4 of the useful layer 2 (at the level of a second bonding interface). The functional layer 6 also has a lower coefficient of thermal expansion than that of the useful layer 2. The functional layer 6 may consist of a material selected from among the following group: silicon, III-V semiconductors, silicon carbide, glass, sapphire. Advantageously, the functional layer 6 may consist of the same material as the support substrate 1. According to one variant, an intermediate layer (not shown) may be present between the functional layer 6 and the useful layer 2, for example, made of silicon oxide, silicon nitride, etc. The intermediate layer may have been deposited on the second face 4 of the useful layer 2 and/or on the face 7 of the functional layer 6 prior to assembly.

The composite structure 9 according to the disclosure is compatible with a heat treatment temperature that is higher than a limit temperature above which the heterostructure 5 deteriorates or breaks in the absence of the functional layer 6. In fact, because of the large difference in the coefficient of thermal expansion (CTE) between the piezoelectric material forming the useful layer 2 and the material forming the support substrate 1, the heterostructure 5 will deteriorate (the support substrate 1 cracks or breaks, the useful layer 2 separates from its first face 3, the useful layer 2 is dislocated or deformed) if it is subjected to a temperature higher than a limit temperature. This limit temperature is related to the difference in CTE between the useful layer 2 and the support substrate 1 and to the respective thicknesses of the useful layer 2 and of the support substrate 1. By way of example, for a heterostructure consisting of a useful layer 2 made of $LiTaO_3$ 10 microns thick and a support substrate 1 made of Si 625 microns thick, the limit temperature is of the order of 150° C. The composite structure 9 according to the disclosure allows for a temperature that is higher than this limit temperature to be applied. For example, the addition of a functional layer 6 made of Si 200 microns thick on the aforementioned example of a heterostructure 5 allows for a heat treatment in the range of 200° C.-400° C. to be applied. A heat treatment in this temperature range is advantageous to consolidate the first bonding interface between the useful layer 2 and the support substrate 1 of the heterostructure 5 and makes it possible to achieve higher bonding energies than with a treatment at a temperature below 150° C.

A heterostructure 5 comprising a very thin useful layer 2 made of piezoelectric material may also be of interest in the field of acoustic wave devices, in particular, BAW devices. One solution for producing such a heterostructure is to transfer the useful layer 2 using the SMART CUT® process, including the formation of a fragile plane buried in a donor substrate made of piezoelectric material by introducing light species such as hydrogen or helium, direct bonding of this donor substrate onto a support substrate 1 made of silicon, and separation at the buried fragile plane so as to transfer a surface layer made of piezoelectric material onto Si. It is known that the surface layer still has defects and light species in its thickness after it has been transferred, which may among others deteriorate its piezoelectric characteristics. To heal this layer, it is therefore essential to apply a heat treatment at an appropriate temperature range: to allow at least part of the defects to be healed and the light species to be released, but without damaging the qualities of the thin layer transferred or the mechanical strength of the heterostructure 5. By way of example, the suitable temperature range to choose for a $LiTaO_3$ layer would be between 400° C. and 600° C., i.e., below the Curie temperature of the material.

Another object of the composite structure 9 according to the disclosure is to allow a healing annealing to be applied to the useful layer 2 of the heterostructure 5, in order to restore its piezoelectric characteristics. By way of example, for a heterostructure consisting of a useful layer 2 made of $LiTaO_3$ 0.5 micron thick and a support substrate 1 made of Si 625 microns thick, the limit temperature is of the order of 400° C. The composite structure 9 according to the disclosure allows for a temperature higher than this limit temperature to be applied. For example, the addition of a functional layer 6 made of Si 50-100 microns thick on the aforementioned heterostructure 5 would allow a heat treatment in the range of 500° C. to 600° C. to be applied.

Advantageously, and accounting for the significant differences in CTE between the useful layer 2 and the support substrate 1 (and the functional layer 6), the functional layer 6 will have a thickness greater than or equal to 10 microns. Preferably, the functional layer 6 will even have a thickness greater than or equal to 50 microns.

According to a first variant of implementation of the composite structure 9 according to the disclosure, the functional layer 6 is removed after the heat treatment, intended to consolidate the first bonding interface of the heterostructure 5 and/or to heal all or part of the defects in the useful layer 2, is applied to the composite structure 9. The selected adhesion energy of the second bonding interface between the functional layer 6 and the second face 4 of the useful layer 2 of the heterostructure 5 will be less than 1000 mJ/m², to allow for disassembly of the functional layer 6. The term disassembly is used here to convey the separation between the functional layer 6 and the heterostructure 5 at the second bonding interface.

The present disclosure thus makes it possible to obtain a heterostructure 5 whose mechanical strength (consolidated bonding interface) and electrical characteristics (defects of the useful layer fully or partially healed) are compatible with the subsequent development of acoustic wave devices on the useful layer 2. In particular, the adhesion energy between the useful layer 2 and the support substrate 1 of the heterostructure 5 is greater than or equal to 1500 mJ/m².

Figure 2A:
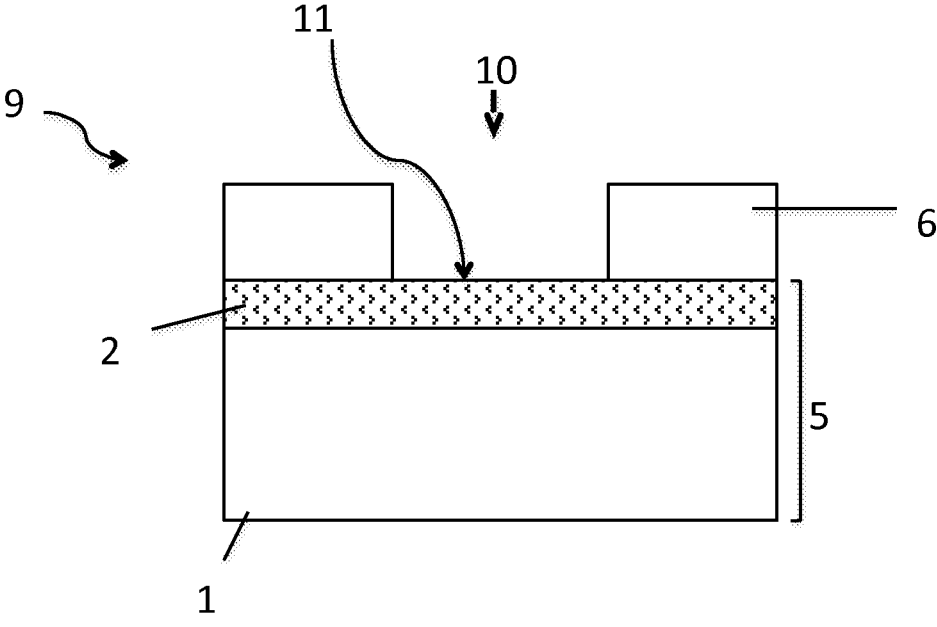
FIGS. 2a to 2C show an alternative implementation of the composite structure.
Figure 2B:
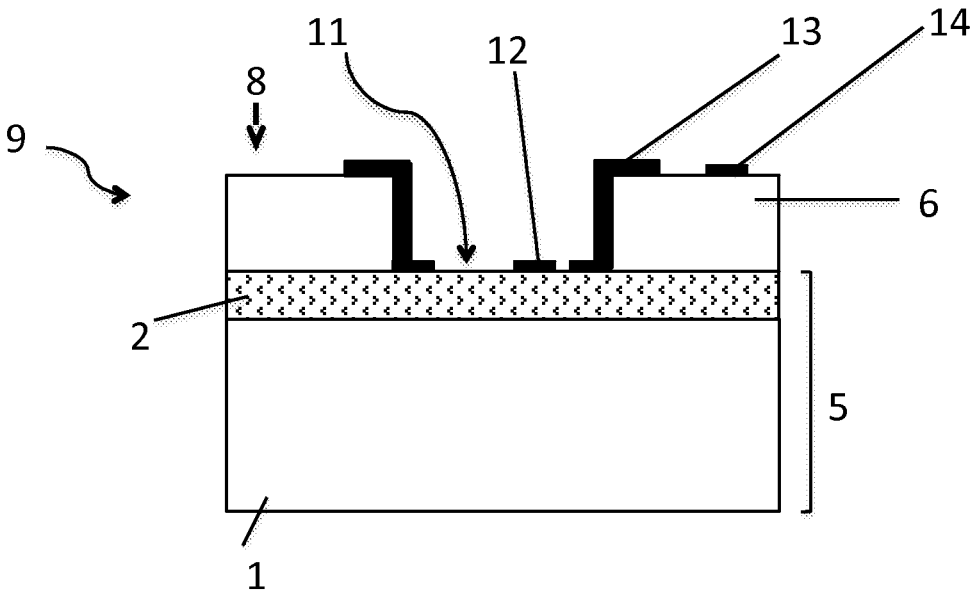

According to a second implementation variant of the composite structure 9 according to the disclosure and, as shown in FIG. 2*a*, one or more first local opening(s) 10 is (are) arranged in the functional layer 6 of the composite structure 9, enabling access to at least one first part 11 of the second face 4 of the useful layer 2. Components can thus be developed on the useful layer 2, at the level of the at least one first part 11. The first part 11 of the second face 4 of the useful layer comprises among others metal elements 12 forming an acoustic wave device, in particular, a SAW device (FIG. 2*b*). The metal elements 12 may, for example, consist of interdigitated electrodes and associated contact pads.

The composite structure 9 according to this second variant may provide a more advantageous mechanical strength than the heterostructure 5 alone. More specifically, it may be compatible with heat treatments at higher temperatures than a heterostructure 5 devoid of any functional layer 6, when manufacturing the acoustic wave device.

Figure 2C:
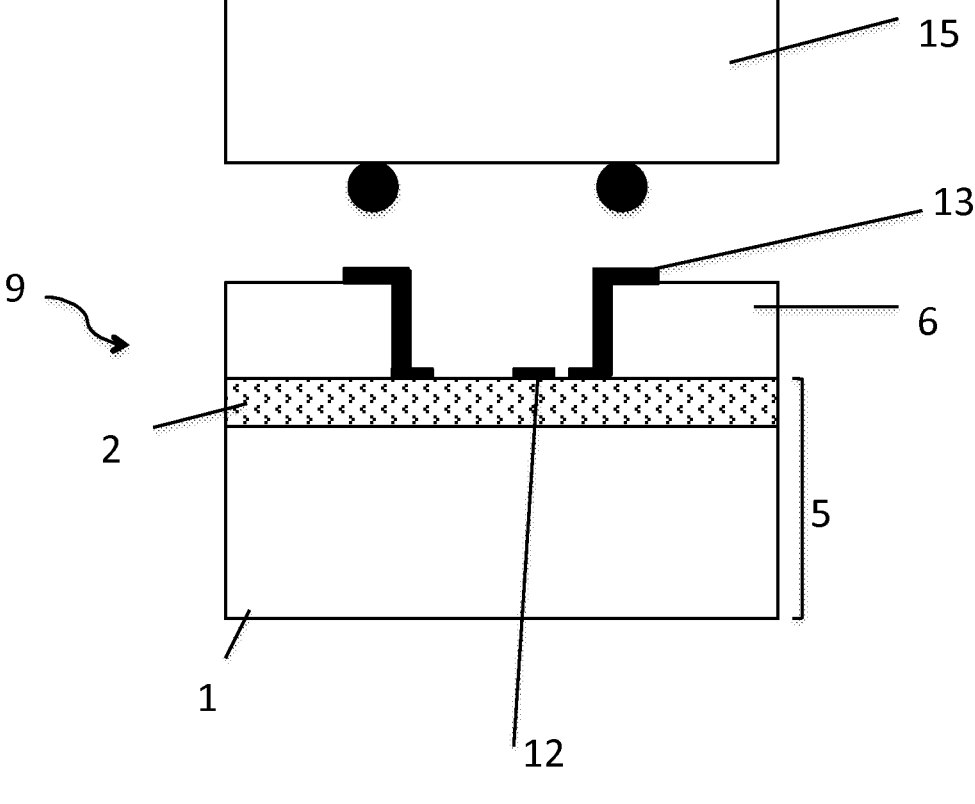

According to an optional mode of implementation of this second variant, the functional layer 6 comprises metal contacts 13 and/or electronic devices 14 electrically connected to certain metal elements 12 arranged on the useful layer 2. In this mode of implementation, the composite structure 9 enables the contact pads of the SAW devices on the useful layer 2 to be displaced to the face 8 of the functional layer 6. This configuration may be of interest especially to facilitate vertical interconnections and an assembly with a cover 15 ("wafer level packaging," shown in FIG. 2c). The composite structure 9 furthermore makes it possible to co-integrate components, some metal elements 12 developed on a piezoelectric material (the useful layer 2), other electronic devices 14 developed on the functional layer 6 (e.g., a silicon-type semi-conductor layer).

Figure 3:
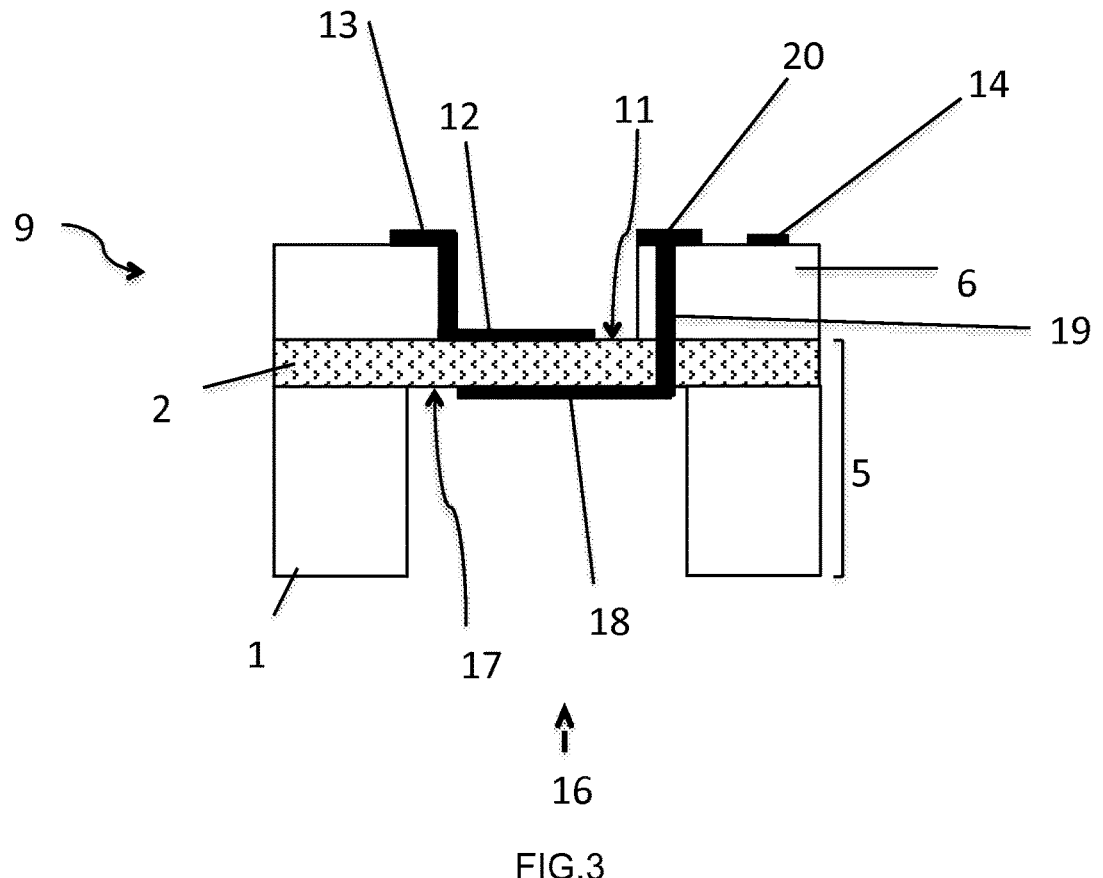
FIG. 3 shows another alternative implementation of the composite structure.

According to a third variant of implementation of the composite structure 9 according to the disclosure and as shown in FIG. 3, the support substrate 1 also comprises one (or several) second local opening(s) 16 enabling access to the at least one second part 17 of the first face 3 of the useful layer 2. The second local opening 16 will be at least partially facing a first local opening 10 arranged in the functional layer 6; the first local opening 10 enables access to at least one first part 11 of the second face 4 of the useful layer 2. The first part 11 and second part 17, respectively, of the second face 4 and first face 3 of the useful layer 2 comprise metal elements forming an acoustic wave device, e.g., a BAW device. The functional layer 6 and/or the support substrate 1 comprise(s) metal contacts 13, 20 and/or electronic devices 14 electrically connected to certain metal elements 12, 18 arranged on the first part 11 and second part 17 of the useful layer. 2. As shown in FIG. 3, metal elements 18 arranged on the second part 17 of the useful layer 2 may be connected to contact pads 20 on the functional layer 6 by means of through-hole vias 19.

Figure 4A:
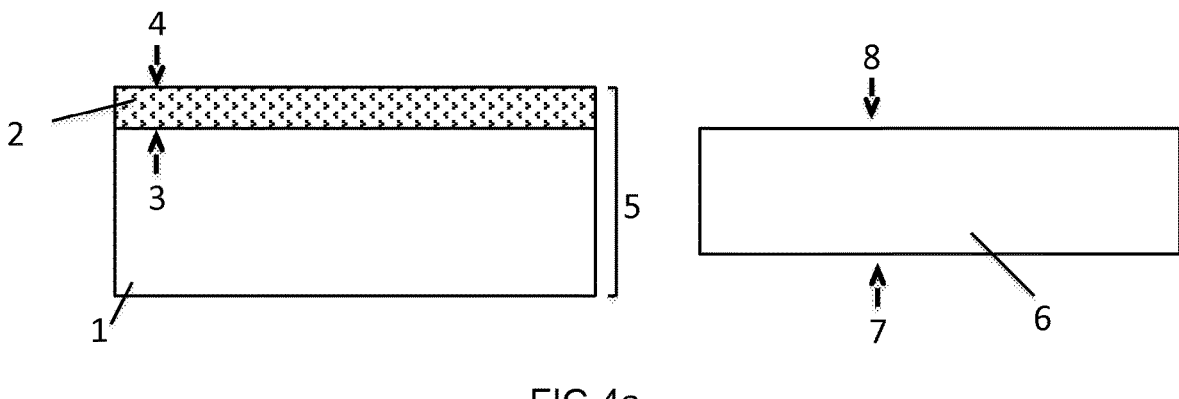
FIGS. 4a to 4c show steps of the manufacturing method according to the disclosure of the composite structure.
Figure 4B:
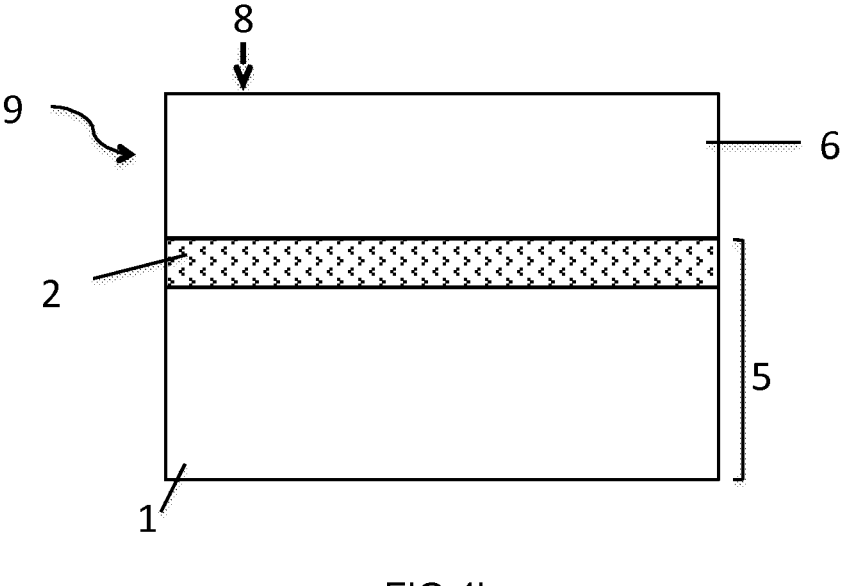

The disclosure also relates to a method for manufacturing a composite structure 9 for an acoustic wave device. The method includes a step of providing a heterostructure 5 comprising a useful layer 2 of piezoelectric material, having a first face 3 and a second face 4 (FIG. 4a). The first face 3 is arranged on a support substrate 1 having a lower coefficient of thermal expansion than that of the useful layer 2. The method further comprises a step of assembling the entire surface of a face 7 of a functional layer 6 (FIG. 4a) on the second face 4 of the useful layer 2 to form the composite structure 9 (FIG. 4b), the functional layer 6 having a lower coefficient of thermal expansion than that of the useful layer 2. This assembly step may consist in direct bonding by molecular adhesion. The surfaces to be assembled, respectively of the functional layer 6 and of the useful layer 2, may advantageously undergo a cleaning sequence to prepare them for direct bonding. For example, chemical cleaning based on ozone and RCA may be applied as well as an $O_2$ or $N_2$ plasma treatment for surface activation. Optionally, an intermediate layer may be deposited on the face 7 of the functional layer 6 and/or on the face 4 of the useful layer 2, e.g., a silicon oxide or silicon nitride layer.

The method according to the disclosure also comprises a step in which a heat treatment is applied to the composite structure 9 at a temperature higher than a limit temperature above which the heterostructure 5 deteriorates or breaks in the absence of the functional layer 6. In fact, because of the large difference in the coefficient of thermal expansion (CTE) between the piezoelectric material forming the useful layer 2 and the material forming the support substrate 1, the heterostructure 5 will deteriorate (the support substrate 1 cracks or breaks, the useful layer 2 separates from its first face 3, the useful layer 2 is dislocated or deformed) when it is subjected to a temperature higher than a limit temperature. This limit temperature is related to the difference in CTE between the useful layer 2 and the support substrate 1 and to the respective thicknesses of the useful layer 2 and of the support substrate 1.

It is essential that the entire surface of the face 7 of the functional layer 6 is assembled onto the second face 4 of the useful layer 2, so as to uniformly control the differential expansion between the functional layer 6 and the useful layer 2 and to provide the composite structure with the best mechanical strength during subsequent heat treatment. Local bonding of the functional layer 6 to the useful layer 2 would be less favorable for the mechanical strength of the composite structure 9 at temperatures higher than the limit temperature supported by the heterostructure 5. During the heat treatment step, the composite structure 9 will thus be compatible with a temperature greater than or equal to 250° C., more specifically between 250° C. and 600° C., depending on the materials and the respective thicknesses of the functional layer 6 and useful layer 2 and of the support substrate 1.

Figure 4C:
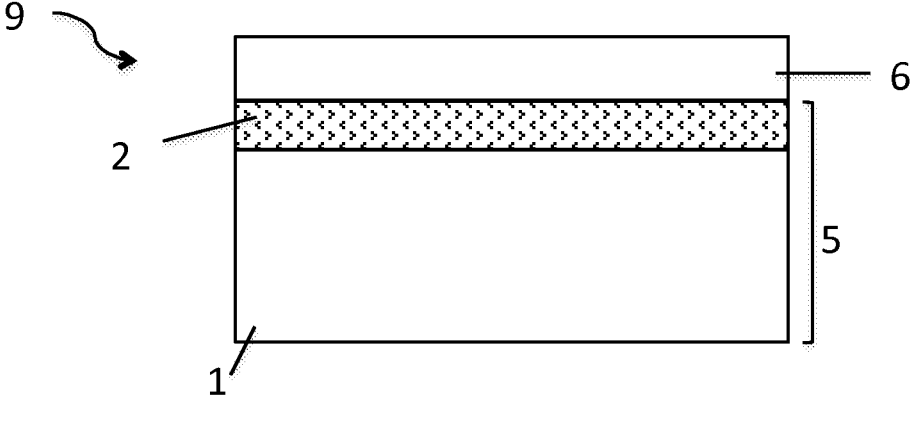

According to one variant, the method according to the disclosure comprises a step for adjusting the thickness of the functional layer 6 (FIG. 4c), performed prior to the heat treatment step, to achieve a functional layer 6 thickness that is greater than or equal to a threshold thickness. Advantageously, this threshold thickness will be chosen to be greater than or equal to 10 microns. Preferably, the functional layer 6 will even have a thickness greater than or equal to 50 microns.

The thickness adjustment step may consist in mechanical, chemical-mechanical and/or chemical thinning.

According to a first implementation variant, the method according to the disclosure may comprise a step in which the functional layer 6 is removed, after the heat treatment step, through disassembly of the composite structure 9 at a bonding interface, between the functional layer 6 and the useful layer 2 (called the second bonding interface). The assembly step of the method between the functional layer 6 and the useful layer 2 must have been performed in such a way that the second bonding interface can later be disassembled. More specifically, it must have been performed in such a way that the bonding energy at this interface is less than 1000 $mJ/m^2$. By way of example, the assembly step may consist in oxide/oxide bonding, the face 7 of the functional layer 6 and the face 4 of the useful layer 2 being provided with a silicon oxide layer. The surface roughness of the oxide layers must be chosen in the range of 0.1 to 0.5 nm RMS, so as to obtain a bonding energy of less than 1000 $mJ/m^2$, e.g., of the order of 500 $mJ/m^2$.

Disassembly, after the heat treatment step, may, for example, be performed by applying a mechanical stress at the second bonding interface of the composite structure 9, i.e., at the interface between the functional layer 6 and the useful layer 2.

Following this step of removing the functional layer 6, the heterostructure 5 is obtained with a consolidated bonding interface that is compatible with the subsequent steps of manufacturing an acoustic wave device.

Alternatively, the complete removal of the functional layer 6 can be achieved by mechanical, chemical-mechanical or chemical thinning techniques.

According to a second variant of implementation, the method according to the disclosure comprises a step of local removal of the functional layer 6 to enable access to at least one first part 11 of the second face 4 of the useful layer 2. This local removal step may consist in wet or dry chemical etching in areas defined, for example, using photolithography techniques. By way of example, local removal may be achieved on a plurality of areas enabling access to a percentage (opening rate) of the second face 4 of the useful layer 2. The opening rate ranges from a few % to <100%, depending on the devices to be developed. The method then comprises a step of producing acoustic wave devices comprising metal elements 12 on the plurality of first parts 11 (FIG. 2*b*). This step of producing devices may include among others the development of contact pads 13 on the functional layer 6, which are electrically connected to the acoustic wave devices on the useful layer 2.

According to a third implementation variant, which may or may not be combined with the second mode of implementation, the method according to the disclosure may further comprise a step of locally removing the support substrate 1 to enable access to at least one second part 17 of the first face 3 of the useful layer 2. This local removal step may consist in wet or dry chemical etching in areas defined, for example, using photolithography techniques.

By way of example, local removal may be achieved in a plurality of areas with an opening rate ranging from 1% to 50%. Advantageously, to enable the production of bulk acoustic wave devices, the plurality of second parts 17 and the plurality of first parts 11 will be facing each other at least partially, thus making it possible to obtain a local self-bearing useful layer 2 membrane. The method then includes a step of producing acoustic wave devices comprising metal elements 18 on the plurality of second parts 17 of the useful layer 2, as shown in FIG. 3.

Optionally, the method may include a step of producing components 14 on the functional layer 6 and/or on the support substrate 1, and/or a step of electrical connection between metal elements 12, 18 arranged on the useful layer 2 and metal contacts 13, 20 arranged on the functional layer 6 and/or on the support substrate 1.

EXAMPLE 1

A heterostructure 5 comprising a useful layer 2 made of lithium niobate (LiNbO3) 20 microns thick and a support substrate 1 made of silicon (Si) 625 microns thick and 150 mm in diameter has a bonding energy well below 1 J/m2. Prior to producing the acoustic wave devices on this heterostructure, it is essential to strengthen its bonding interface. To achieve this, a heat treatment must be applied to it at a temperature of 250° C. for 2 hours.

The functional layer 6 is a silicon substrate (150 mm in diameter and 625 microns thick) comprising an intermediate layer of silicon oxide 400 nm thick on its front face 7. The silicon oxide layer has a surface roughness of the order of 0.2 nm RMS. The functional layer 6 then undergoes cleaning (typically ozone and RCA), prior to its assembly onto the second face 4 of the useful layer 2 of the heterostructure 5. The heat treatment at 250° C. is then applied to the composite structure 9 for 2 hours. The composite structure is able to withstand a thermal budget of 250° C./2 hours, without being damaged and without generating any deterioration of the heterostructure 5. If used alone, the heterostructure 5 would have deteriorated (cracking or breakage of the support substrate 1 and/or partial or complete separation of the useful layer 2), had it been subjected to this thermal budget prior to reinforcing its bonding interface, or even at a lower thermal budget of the order of 200° C.

Once the heat treatment has been performed, the functional layer 6 is disassembled by inserting a beveled tool at the level of the bonding interface between the functional layer 6 and the useful layer 2. The heterostructure 5 has a reinforced bonding interface, of the order of 1.5 J/m$^2$, which provides suitable mechanical strength during the subsequent acoustic wave device development steps.

EXAMPLE 2

A heterostructure 5 is formed out of a useful layer 2 made of lithium tantalate (LiTaO$_3$) 0.3 microns thick and a support substrate 1 made of silicon (Si) 625 microns thick and 150 mm in diameter. The useful layer 2 was transferred using the SMART CUT® process and, after separation, had defects in its thickness that are prohibitive for producing acoustic wave devices, since they affect the piezoelectric properties of the useful layer 2. Prior to producing the acoustic wave devices on this heterostructure 5, it is therefore essential to heal all or part of these defects. To achieve this, a heat treatment must be applied at a temperature of 550° C. for 2 hours.

The functional layer 6 is a silicon substrate (150 mm in diameter and 625 microns thick) comprising an intermediate layer made of silicon oxide 400 nm thick on its front face 7. It undergoes cleaning (typically ozone and RCA) and an O2 plasma treatment, prior to being assembled onto the second face 4 of the useful layer 2 of the heterostructure 5. A thickness adjustment step is then carried out on the functional layer 6 using mechanical thinning (grinding) and then chemical-mechanical polishing to achieve a final thickness of 200 microns.

The composite structure 9 thus formed is able to withstand a thermal budget of 550° C./2 hours, without being damaged and without generating any deterioration of the heterostructure 5. If used alone, the heterostructure 5 would have deteriorated (cracking or breakage of the support substrate 1 and/or partial or complete separation of the useful layer 2), had it been subjected to this thermal budget without any functional layer 6.

The heat treatment having been applied to the composite structure 9, the functional layer 6 is disassembled by applying a localized stress to the second bonding interface between the functional layer 6 and the useful layer 2. Alternatively, the functional layer 6 is removed by a mechanical followed by a chemical thinning sequence.

The heterostructure 5 has a reinforced bonding interface, greater than or equal to 1.5 J/m$^2$ due to the thermal budget applied and the useful layer 2 has been healed of the majority of the defects related to the implantation of light species such as hydrogen or helium (SMART CUT® process), making it compatible with the production of acoustic wave devices. By way of example, the extent to which the defects in the useful layer 2 have been healed can be assessed by producing electrical devices and testing their level of performance, making it possible to validate the electrical quality of the useful layer 2.

EXAMPLE 3

A heterostructure 5 is formed out of a useful layer 2 made of lithium tantalate (LiTaO$_3$) 0.3 microns thick and a support substrate 1 made of silicon (Si) 625 microns thick and 150 mm in diameter. The useful layer 2 was transferred using the SMART CUT® process and, after separation, had defects in its thickness that are prohibitive for producing acoustic wave devices, since they affect the piezoelectric properties of the useful layer 2. Prior to producing the acoustic wave devices on this heterostructure 5, it is therefore essential to heal these defects. To achieve this, a heat treatment must be applied at a temperature of 500° C. for 2 hours.

The functional layer 6 is a silicon substrate (150 mm in diameter and 625 microns thick) comprising an intermediate layer made of silicon oxide 400 nm thick on its front face 7. It undergoes cleaning (typically ozone and RCA) and an O2 plasma treatment, prior to being assembled onto the second face 4 of the useful layer 2 of the heterostructure 5. A thickness adjustment step is then carried out on the functional layer 6 using mechanical thinning (grinding) and then chemical-mechanical polishing to achieve a final thickness of 10 microns.

The composite structure 9 thus formed is able to withstand a thermal budget of 500° C./2 hours, without being damaged and without generating any deterioration of the heterostructure 5. If used alone, the heterostructure 5 would have deteriorated (cracking or breakage of the support substrate 1 and/or partial or complete separation of the useful layer 2), had it been subjected to this thermal budget without any functional layer 6.

Since the heat treatment has been applied to the composite structure 9, the heterostructure 5 has a reinforced bonding interface, greater than 1.5 J/m² due to the thermal budget applied and the useful layer 2 has been healed of a large part of the defects related to the implantation of light species such as hydrogen or helium (SMART CUT® process), making it compatible with the production of acoustic wave devices.

A step consisting in local removal of the functional layer 6 is then carried out to enable access to at least one first part 11 of the second face 4 of the useful layer 2. This local removal step may consist in wet or dry chemical etching at the level of areas defined using photolithography. The local removal can be performed in a plurality of areas enabling access to a plurality of first parts 11 and representing an opening rate of the order of 50%. Acoustic wave devices can then be developed on the plurality of first parts 11 of the useful layer 2. These devices comprise metal elements 12, typically interdigitated electrodes. The presence of the functional layer 6 on the useful layer 2, even if partial, makes it possible to carry out treatments at higher temperatures than in the case where the heterostructure 5 is used alone. This is favorable for the use of more efficient materials or technologies to produce acoustic wave devices.

Contact pads 13 on the functional layer 6 may be electrically connected to the acoustic wave devices on the useful layer 2. Components can also be developed on the functional layer 6. The composite structure 9 thus facilitates the co-integration of components on piezoelectric materials (the useful layer) and on semiconductor materials (the functional layer).

Of course, the disclosure is not limited to the sole modes of implementation described and various implementations can be provided without going beyond the ambit of the disclosure as defined by the claims.

The composite structure according to the disclosure is of great interest for the manufacturing of acoustic wave devices, for example, in the field of SAW and BAW filters for radiofrequency applications, but also in the field of piezoelectric sensors. In fact, since the latter enable the transformation of mechanical movements into electrical signals, and this with a very high sensitivity, several fields of application open or are likely to open in the areas of temperature sensors, energy harvesting, etc.

The invention claimed is:

1. A composite structure for an acoustic wave device comprising a heterostructure, including:
   a useful layer of piezoelectric material, having a first face and a second face, the first face being arranged at a first bonding interface between the useful layer and a support substrate, the support substrate having a lower coefficient of thermal expansion than that of the useful layer; and
   a functional layer, the functional layer being substantially planar and having a substantially planar main face, the entirety of the substantially planar main face being arranged on the second face of the useful layer at a second bonding interface between the functional layer and the useful layer, the functional layer having a lower coefficient of thermal expansion than that of the useful layer,
   wherein the functional layer exhibits a substantially uniform thickness along a longitudinal axis of the composite structure, and
   wherein an adhesion energy of the first bonding interface between the useful layer and the support substrate of the heterostructure is greater than or equal to 1500 mJ/m².

2. The composite structure of claim 1, wherein the functional layer has a thickness greater than or equal to 10 microns.

3. The composite structure of claim 1, wherein the useful layer comprises a material selected from the group consisting of lithium tantalate (LiTaO₃), lithium niobate (LiNbO₃), aluminum nitride (AIN), and zinc oxide (ZnO).

4. The composite structure of claim 1, wherein the functional layer comprises a material selected from the group consisting of silicon, III-V semiconductors, silicon carbide, glass, and sapphire.

5. The composite structure of claim 1, wherein the support substrate comprises a material selected from the group consisting of silicon, III-V semiconductors, silicon carbide, glass, and sapphire.

6. The composite structure of claim 1, wherein the functional layer and the support substrate consist essentially of the same material.

7. The composite structure of claim 1, wherein the functional layer comprises at least one first local opening enabling access to at least one first part of the second face of the useful layer, and wherein the first part of the second face of the useful layer comprises metal elements forming an acoustic wave device.

8. The composite structure of claim 1, wherein:
   the functional layer comprises at least one first local opening enabling access to at least one first part of the second face of the useful layer;
   the support substrate comprises at least one second local opening, at least partially facing the first local opening and enabling access to at least one second part of the first face of the useful layer; and
   the first and second parts, respectively, of the second and first faces of the useful layer comprise metal elements forming an acoustic wave device.

9. The composite structure of claim 7, wherein the functional layer and/or the support substrate comprise(s) metal contacts and/or electronic devices electrically connected to metal elements arranged on the useful layer.

10. A composite structure for an acoustic wave device comprising a heterostructure, including:
   a useful layer of piezoelectric material, having a first face and a second face, the first face being arranged at a first bonding interface between the useful layer and a support substrate, the support substrate having a lower coefficient of thermal expansion than that of the useful layer; and
   a functional layer, the functional layer being substantially planar and having a substantially planar main face, the entirety of the substantially planar main face being arranged on the second face of the useful layer at a second bonding interface between the functional layer and the useful layer, the functional layer having a lower coefficient of thermal expansion than that of the useful layer, wherein the functional layer exhibits a substantially uniform thickness along a longitudinal axis of the composite structure, and wherein the adhesion energy of the second bonding interface between the functional layer and the heterostructure is less than 1000 mJ/m².

11. The composite structure of claim 10, wherein the functional layer has a thickness greater than or equal to 10 microns.

12. The composite structure of claim 10, wherein the useful layer comprises a material selected from the group consisting of lithium tantalate (LiTaO$_3$), lithium niobate (LiNbO$_3$), aluminum nitride (AlN), and zinc oxide (ZnO).

13. The composite structure of claim 10, wherein the functional layer comprises a material selected from the group consisting of silicon, III-V semiconductors, silicon carbide, glass, and sapphire.

14. The composite structure of claim 10, wherein the support substrate comprises a material selected from the group consisting of silicon, III-V semiconductors, silicon carbide, glass, and sapphire.

15. The composite structure of claim 10, wherein the functional layer and the support substrate consist essentially of the same material.

16. The composite structure of claim 10, wherein the functional layer comprises at least one first local opening enabling access to at least one first part of the second face of the useful layer, and wherein the first part of the second face of the useful layer comprises metal elements forming an acoustic wave device.

17. The composite structure of claim 10, wherein:

the functional layer comprises at least one first local opening enabling access to at least one first part of the second face of the useful layer;

the support substrate comprises at least one second local opening, at least partially facing the first local opening and enabling access to at least one second part of the first face of the useful layer; and the first and second parts, respectively, of the second and first faces of the useful layer comprise metal elements forming an acoustic wave device.

18. The composite structure of claim 16, wherein the functional layer and/or the support substrate comprise(s) metal contacts and/or electronic devices electrically connected to metal elements arranged on the useful layer.

*     *     *     *     *